US 6,664,122 B1

(12) United States Patent
Andryuschenko et al.

(10) Patent No.: US 6,664,122 B1
(45) Date of Patent: Dec. 16, 2003

(54) ELECTROLESS COPPER DEPOSITION METHOD FOR PREPARING COPPER SEED LAYERS

(75) Inventors: Tatyana N. Andryuschenko, Portland, OR (US); Jonathan D. Reid, Sherwood, OR (US); Steven T. Mayer, Lake Oswego, OR (US); Eric G. Webb, Salem, OR (US)

(73) Assignee: Novellus Systems, Inc., San Jose, CA (US)

( * ) Notice: Subject to any disclaimer, the term of this patent is extended or adjusted under 35 U.S.C. 154(b) by 162 days.

(21) Appl. No.: 09/996,425

(22) Filed: Nov. 27, 2001

Related U.S. Application Data
(60) Provisional application No. 60/346,170, filed on Oct. 19, 2001.

(51) Int. Cl.[7] .......................... H01L 21/66; H01L 21/44

(52) U.S. Cl. ........................................ 438/17; 438/687

(58) Field of Search .............................. 438/10, 12, 17, 438/678, 687; 427/96, 98, 8, 9, 10

(56) References Cited

U.S. PATENT DOCUMENTS

| | | |
|---|---|---|
| 5,151,168 A | 9/1992 | Gilton et al. |
| 5,576,052 A | 11/1996 | Arledge et al. |
| 5,674,787 A | 10/1997 | Zhao et al. |
| 5,824,599 A | 10/1998 | Schacham-Diamand et al. |
| 5,891,513 A | 4/1999 | Dubin et al. |
| 5,913,147 A | 6/1999 | Dubin et al. |
| 5,969,422 A | 10/1999 | Ting et al. |
| 5,972,192 A | 10/1999 | Dubin et al. |
| 6,065,424 A | 5/2000 | Shacham-Diamand et al. |
| 6,136,707 A | 10/2000 | Cohen |
| 6,197,181 B1 | 3/2001 | Chen |

FOREIGN PATENT DOCUMENTS

WO  99/47731  9/1999

OTHER PUBLICATIONS

Andryuschenko et al., "Electroless and Electrolytic Seed Repair Effects on Damascene Feature Fill," Proceedings of Internatonal Interconnect Tech. Conf., San Francisco Ca., Jun. 4–6, 2001, pp 33–35.

Chen et al., "EDC Seed Layer for Inlaid Copper Metallisation," Semiconductor Fabtech—12th Edition, 5 pages, Jul. 2000.

Ken M. Takahasi, "Electroplating Copper into Resistive Barrier Films," Journal of the Electrochemical Society, 147 (4) 1417–1417 (2000).

T.P. Moffat et al., "Superconformal Electrodeposition of Copper in 500–90 nm Features," Journal of the Electrochemical Society, 147 (12) 4524–4535 (2000).

Ritzdorf et al., "Electrochemically Deposited Copper," Conference Proceedings ULSI XV 2000, Materials Research Society, 101–107.

(List continued on next page.)

*Primary Examiner*—Evan Pert
(74) *Attorney, Agent, or Firm*—Beyer Weaver & Thomas, LLP

(57) ABSTRACT

Disclosed is a procedure for deposition of a thin and relatively continuous electroless copper film on the substrate of sub-micron integrated circuit features. The electroless copper film is deposited onto a previously deposited PVD copper film, which may be discontinuous. The continuous film formed by electroless deposition allows for sufficient filling of the sub-micron integrated circuit features by electrodeposition. The electroless bath employed to form the continuous electroless copper film may be composed of a reducing agent, a complexing agent, a source of copper ions, a pH adjuster, and optionally one or more surfactants and/or stabilizers. In one example, the reducing agent contains an aldehyde moiety.

34 Claims, 12 Drawing Sheets

OTHER PUBLICATIONS

Reid et al., "Optimization of Damascene Feature Fill for Copper Electroplating Process," Shipley Company, IITC 1999, 3 Pages.

Reid et al., "Copper PVD and Electroplating," Solid State Technology, Jul. 2000, www.solid–state.com, 86–103.

Reid et al., "Factors Influencing Fill of IC Features Using Electroplated Copper," Adv Met Conf Proc 1999, MRS 10 Pages, (2000).

Shacham–Diamond et al., "Copper Electroless Depostion Technology for Ultr–Large–Scale–Integration (ULSI) Metallization," Microelectronic Engineering 33 (1997) 47–58.

4:1 AR, 0.25 μm trench

Electroless :Cu-1.25g/l; EDTA-14g/l; Glyoxylic acid-6.5g/l; KOH to pH 12.8, 40C

Electroplate: UF, POR 1.000S (1A hot entry)

No electroless          37-38C, 30 sec          37-38C, 60 sec

IBM 170 coupons: 0.18 micron vias seeded with 300 Ta/1500 delta HCM Cu.

Electroless deposition conditions:pH 12.8, 1.25 g/L Cu, 14 g/L EDTA, 6.5 g/L glyoxylic acid.

Fill using 24 hr old Viaform bath.

ELECTROLESS COPPER DEPOSITION METHOD FOR PREPARING COPPER SEED LAYERS

CROSS-REFERENCE TO RELATED APPLICATIONS

This application claims priority under 35 USC 119(e) from U.S. Provisional Application No. 60/346,170, filed Oct. 19, 2001, by S. T. Mayer et al., and titled "IMPROVED HARDWARE FOR ELECTROLESS AND ELECTRO-PLATING OF ULSI DAMASCENE COPPER." That application is incorporated herein by reference for all purposes.

BACKGROUND

This invention relates to the formation of Damascene copper interconnects for integrated circuits. More specifically, the invention provides a procedure and conditions for deposition of a thin and relatively continuous electroless copper film on the surface of sub-micron integrated circuit features.

The Damascene process provides inlaid copper lines in dielectric layers of integrated circuits. The copper lines provide electrical routing between circuit elements in the integrated circuit. Damascene copper lines are rapidly replacing traditional aluminum etched lines in high-performance integrated circuitry.

In a Damascene process, both copper lines and vias are provided in horizontal layers of dielectric. A typical Damascene process begins by patterning an etch-resistant photoresist on a previously deposited layer of dielectric on a wafer face. Thereafter, trenches defining the horizontal copper routing are etched into the dielectric surface to a specified depth. The depth does not extend the whole way through the dielectric to underlying conductive features in a lower level metal layer or in the silicon substrate.

After the trenches have been etched, the photoresist is removed and a new etch resistant photoresist is deposited. This new layer of photoresist defines a via pattern in the dielectric of the wafer face. The vias are subsequently etched through the dielectric to the underlying metal lines or circuit elements. The vias provide a pathway between conductive features on different layers of the integrated circuit. After etching the vias, the photoresist is removed.

At this point, trenches and vias have been etched into the dielectric, but no conductive lines or interconnects have been added. In most implementations of the Damascene process, copper lines and interconnects are formed primarily by electrodeposition. But electrodeposition cannot commence unless there is an electrically conductive surface that can serve as a cathode onto which copper can deposit. Obviously, the electrically insulating dielectric layer is an inadequate cathode. To allow electrodeposition, a conductive surface must be provided over the surface of the dielectric layer and within the trenches and vias.

In addition, a diffusion barrier must be provided on the surface of the dielectric to prevent copper from diffusing into the dielectric surface. If copper were to diffuse into dielectric material, the dielectric layer's insulating properties would be compromised and the integrated circuit could fail.

With these goals in mind, the Damascene process typically employs physical vapor deposition (PVD) of first a diffusion barrier layer and then a copper seed layer. These layers, are deposited in succession into vias and routing lines, pre-etched in dielectric surfaces. Many suitable barrier layers may be employed such as tantalum, titanium nitride, etc. The copper seed layer serves as a conductive substrate unto which bulk copper may be electrodeposited. The seed layer is a thin layer (typically 800–2000 angstroms nominal) that covers the entire face of the wafer, following the sharp contours of the recessed features.

With the barrier and seed layers in place, the electroplating operation can begin. Electroplating fills the etched vias and trenches with copper and continues until the copper forms a continuous sheet over the entire wafer surface. Thereafter, the top portion of the copper is removed from the wafer face to expose the unetched regions of the dielectric layer and leave copper-filled interconnect circuitry.

One limitation of this process sequence is the difficulty in achieving a continuous PVD copper seed layer within high aspect ratio features without causing the features to close off at the top. Understand that as greater and greater quantities of copper seed are deposited by PVD, more complete coverage within a deep feature is attained. But this comes at the expense of pinch-off at the top of the feature, as depicted in FIG. 1. As shown, pinch-off prematurely closes the upper portion (neck) of the trench or via, thereby preventing complete fill of the bottom portions of the feature.

The physics of the PVD process inherently deposits copper on the top or higher regions of a trench or via, thereby creating a narrow neck. This excess of copper at this neck of a recessed feature causes further build up during the subsequent electrodeposition process. Ultimately, the pinch-off region in the initial seed layer blocks further deposition in the lower regions of the feature and leaves a center void within the copper fill of the feature. It is now understood that pinch-off commonly occurs and when it does, it renders void-free filling by electrodeposition nearly impossible. This problem is particularly acute in high aspect ratio features of small width (e.g., AR greater than about 6:1 and width less than about 0.2 microns). Even smaller features of future device generations will require somewhat thinner PVD seeds in order to avoid pinch-off prior to or during electroplating.

But thinner seeds typically decrease PVD coverage within openings (recesses), leading to seed layer discontinuities near the base of the trench or via, and thus increasing bottom void formation. FIG. 2 shows a discontinuous seed layer that can result from insufficient copper PVD. When the seed layer is discontinuous near the feature base, the copper growth during electrodeposition is slow or negligible in these areas. As a result, large voids can appear in the base of poorly seeded features because the electrodeposition process takes place only in areas of thicker seed layer (e.g., above the base of a via or trench).

Various options intended to provide seed layers suitable for extended Damascene fill by electrodeposition have been described. These include PVD/CVD Cu bilayers, all CVD seed, barrier optimization to improve PVD Cu smoothness at low thickness, atomic layer deposition, wet process seed deposition (Y. Lantasov, R. Palmans, K. Maex, Advanced Metallization Conf. Proc, pp 30–31, Oct. 3–5, 2000), and augmentation of PVD seed using wet processes (L. Chen, T. Ritzdorf, Semicon. Fabtech, July 2000). None of these is entirely suitable.

At least three patents mention that a seed layer may comprise two or more sub-layers, each serving a different role. These patents are U.S. Pat. No. 6,179,181B1 issued to Chen, U.S. Pat. No. 6,136,707 issued to Cohen, and U.S. Pat. No. 5,913,147 issued to Dubin et al. The latter two patents indicate that one process may involve initially depositing a partial seed layer by PVD, followed by depositing the remainder of the seed layer by electroless plating. However, each of these patents is essentially prophetic and contains no meaningful indication of how the electroless deposition may take place in such two-phase process.

The inventor's work has shown that new options for copper seed layers of future generation Damascene features, particularly high aspect ratio features, must be developed. Such processes should form a continuous layer of copper seed that does not cause pinch-off at the top of a high-aspect ratio feature.

SUMMARY OF THE INVENTION

The present invention addresses this need by providing a procedure and associated conditions for deposition of a thin and relatively continuous electroless copper film within sub-micron integrated circuit recessed features. The electroless copper film is deposited onto a partially completed seed layer, which may be discontinuous. In many instances, the partially completed seed layer is a previously deposited PVD copper film. For example, the film may be a PVD seed layer having a nominal thickness as at least about 250 angstroms. The electroless plating process may proceed until the electroless plated copper layer attains a thickness of between about 50–500 angstroms.

The continuous film formed by electroless deposition allows for subsequent filling of the sub-micron integrated circuit features by electrodeposition. Preferably, the electroless bath employed to form the continuous electroless copper film is composed of a reducing agent, a complexing agent, a source of copper ions, a pH adjuster, and optionally one or more surfactants and/or stabilizers. Reducing agents having aldehyde moieties are particularly preferred.

The two part PVD/electroless copper layers allow for a thinner overall seed layer film. Importantly, the PVD component of the seed layer can remain relatively thin—and discontinuous if necessary. Thus, the processes of this invention can seed small IC features without pinching off recessed features near the recess opening, which might otherwise happen as a result of the normal uneven vertical distribution of PVD coverage.

One aspect of this invention pertains to methods of forming a copper seed layer on a substrate surface. The method may be characterized by the following operations: (a) providing a substrate having a dielectric layer on its surface and openings in said dielectric layer; (b) contacting the substrate surface with an electroless plating bath comprising a reducing agent and a source of copper ions and (c) monitoring the plating rate via a potential between the substrate and a reference electrode. In most applications of interest, at least some of the openings will include a partially complete copper seed layer.

During electroless plating, the electrical potential between the substrate and an arbitrary reference electrode placed in the plating path proximate to the substrate will have a defined potential associated with galvanic half cell reactions taking place at the respective electrodes. When no plating is occurring, the potential changes to a different level. Using this fact, methods of this invention can determine that the electroless plating rate has dropped to approximately zero when the voltage between the reference electrode and the substrate reaches a defined value. In one specific embodiment, the reference electrode is a calomel reference electrode. With such electrode, the process determines that the deposition rate has dropped to approximately zero when the voltage between the reference electrode and the substrate drops to about 0.6 volts or below.

The methods of this invention may also involve monitoring the thickness of the seed layer during deposition by measuring the resistivity of the seed layer. In one embodiment, the plating apparatus includes a multi-point probe for measuring the resistivity of the seed layer.

In the electroless plating solution, the reducing agent preferably includes an aldehyde moiety. A particularly preferred reducing agent is glyoxylic acid. Preferably, the reducing agent is present in a molar concentration of between about 0.01 and 0.2, and more preferably between about 0.02 and 0.1.

The plating solution may include many different components in addition to the reducing agent and source of copper ions. For example, it may include a hydroxide pH adjuster that does not contain alkali metal ions. A particularly preferred example is tetramethyl ammonium hydroxide. The plating solution may also include a complexing agent for copper ions (e.g., EDTA). Other additives may be surfactants and/or stabilizers (e.g., polyethylene glycol).

To promote uniform plating, the invention may require flowing the electroless plating bath over the substrate surface during at least a portion of the time that electroless depositing takes place. In a preferred embodiment, flow is induced at least in part by rotating the substrate in the electroless plating bath. The flow may also be induced by directing fresh or recycled electrolyte onto the substrate via an inlet line into the electroless plating reactor.

To reduce the likelihood of trapped bubbles (air, hydrogen, etc.) on the face of the substrate, the process may require that the substrate be rotated and/or angled during immersion in the plating bath. In a specific embodiment, the process places the substrate in the electroless plating bath while the substrate is tilted at an angle so as to displace gas from the wafer face. More specifically, the process may immerse the substrate in the electroless plating bath in a face down orientation while rotating.

To ensure that the electroless plating bath maintains a suitable chemical composition, it may be necessary to replenish the electroless plating bath with make up plating solution. The replenishing can take place on a regular basis, following a set time or substrate count.

After the electroless plating process has deposited copper to a desired thickness, the process may rinse the deposited electroless copper layer with water. This may be followed by drying the substrate and then electroplating the substrate at a later time. Alternatively, the process may involve electroplating the substrate immediately after electroless deposition and rinsing.

The remainder of the specification will describe these and other features and advantages of the invention in further detail.

DETAILED DESCRIPTION OF THE INVENTION

Introduction

Figure 1:
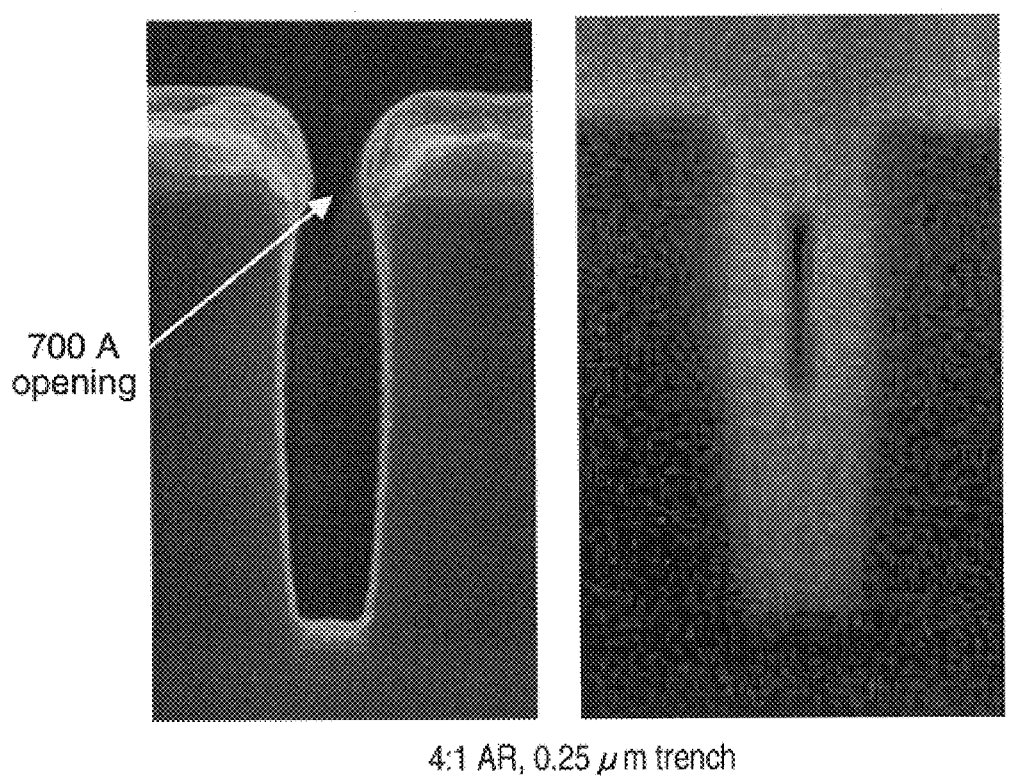
FIG. 1 is a micrograph depicting the problem of pinch off in PVD seed layers of adequate thickness and continuity in high aspect ratio, narrow features.

This invention provides improved methods of forming copper seed layers. This is accomplished by employing electroless copper deposition to form at least part of the seed layer. The invention finds particular usefulness in Damascene processes employing sub-0.5 micron width features having aspect ratios of at least about 3:1. Even more aggressively, the invention finds application in sub-0.2 micron features having aspect ratios of at least about 6:1. The inventive methods monitor the electroless deposition process by ascertaining the rate of deposition and/or the thickness of the electroless plated layer at any given instance in time.

Electroless copper deposition has been employed previously as a conformal copper deposition method for various applications. The most frequent industrial application of electroless copper is a formation of thin (100–500 angstroms) conformal copper films within high aspect ratio holes of printed circuit boards to enable subsequent electroplating. In this process, the dielectric surfaces within the holes are coated with a palladium catalyst on which electroless deposition will take place. The circuit board is then placed in an electroless copper bath and the electroless process begins on both the copper coated surfaces of the board and on the palladium coated dielectric. The ability of electroless copper to initiate on non-electrically connected surfaces while forming a surface which is electrically conductive allows the entire printed circuit board surface to then be electroplated.

In another electroless copper industrial application, the entire conductive copper circuitry of a circuit board is formed by electroless deposition. In its process, the ability of electroless copper to deposit conformally on all geometric surfaces is utilized to yield relatively uniform thickness distributions over the surface. This process is described in U.S. Pat. No. 4,152,467, which is incorporated herein by reference for all purposes. In a related process, copper is first sputtered or evaporated on printed circuit board and then deposited by electroless plating. See U.S. Pat. No. 5,576,052 to Arledge et al., which is incorporated herein by reference for all purposes.

Electroless processes have also been used to limited extent in integrated circuit fabrication. Specifically, they have been employed to fill integrated circuit features with copper. See U.S. Pat. No. 5,824,599 issued to Schacham-Diamond et al., U.S. Pat. No. 5,891,513 issued to Dubin et al., U.S. Pat. No. 5,969,422 issued to Ting et al., and U.S. Pat. No. 6,065,424 issued to Schacham-Diamond et al. Various studies have found that while electroless copper could be deposited within IC features, the resulting fill tends to leave a center seam or void upon completion of the filling process. The somewhat higher resistivity of electroless copper (typically 2.1 micro-ohm-cm) also argues against its use as a complete replacement for electroplated copper.

The present invention employs electroless deposition of copper to form at least a component of a copper seed layer on recessed features of a substrate (e.g., a partially fabricated integrated circuit). One suitable process sequence employing electroless copper deposition in accordance with this invention is depicted in FIG. 3.

The following description assumes that the substrate or work piece to be plated is a wafer, more particularly a semiconductor wafer. The invention is not so limited. The work piece may be of various shapes, sizes, and materials. Generally, any substrate surface having high aspect ratio, narrow width features can be plated with copper in accordance with this invention. In addition to semiconductor wafers, other work pieces that may take advantage of this invention include various conductive articles such as machine tools, recording heads, recording media, and the like.

Figure 3:
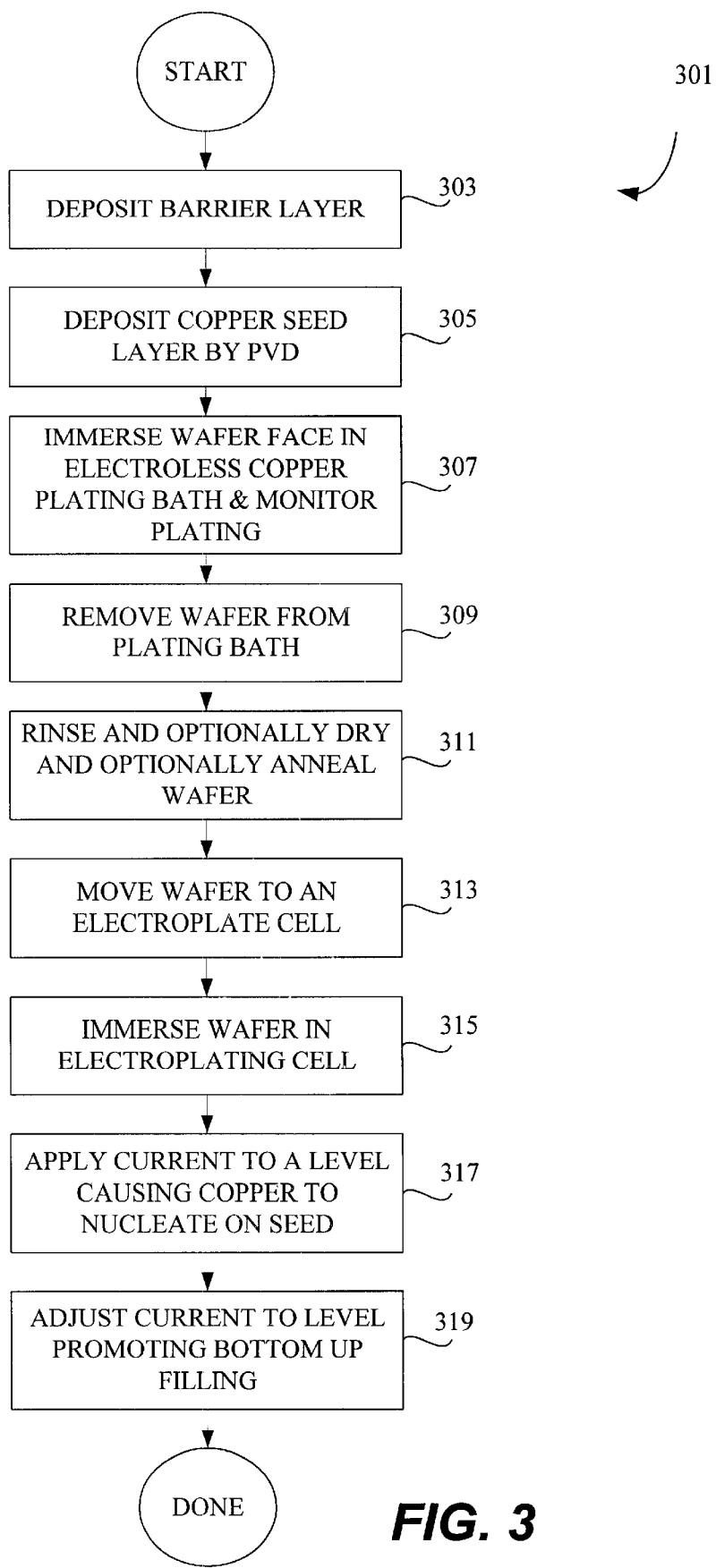
FIG. 3 is a process flow diagram showing a technological context in which the present invention may be employed.

As shown in FIG. 3, a Damascene feature filling process 301 begins at block 303 with deposition of a diffusion barrier layer on a Damascene etched dielectric features of the wafer surface. The barrier layer serves to protect the underlying dielectric material from ingress of copper from subsequently deposited copper lines and interconnects. The barrier may be made from any suitable material such as titanium, tantalum (Ta), tantalum nitride (TaN), tantalum nitride silicon (TaNSi), tungsten (W), titanium (Ti), titanium tungsten (TiW), titanium nitride silicon (TiNSi) and the like. The barrier layer is typically formed by a conventional process such as physical vapor deposition, e.g., sputtering.

After the process forms the diffusion barrier layer, it deposits an initial portion of a copper seed layer by PVD or other suitable process such as CVD. See block 305. This initial portion of the copper seed layer may be deposited to any desired thickness. Preferably, the initial portion of the seed layer is limited to a thickness in which the copper does not build up excessively at the upper regions of recessed features and thereby promote pinch-off. In one example, for openings having a width of about 0.18 micrometers, the thickness of the PVD copper layer is between about 400 and 800 angstroms. PVD copper seed layer formation processes are well known and widely used. In one preferred embodiment, the PVD copper process is performed using a hollow cathode magnetron. HCM PVD uses a hollow metal cathode (target) rather than the flat target that is used in most PVD methods and a DC magnet coil instead of an RF magnet coil. In some cases, HCM PVD is preferable to other PVD methods because is achieves up to about 90% ionization of the copper atoms, rather than the mere 2% that is typical of other methods. Because of this ionization ratio, among other reasons, HCM provides more conformal coverage of the substrate surface. One example of an apparatus suitable for HCM PVD is the INOVA, available from Novellus Systems of San Jose, Calif.

Figure 2:
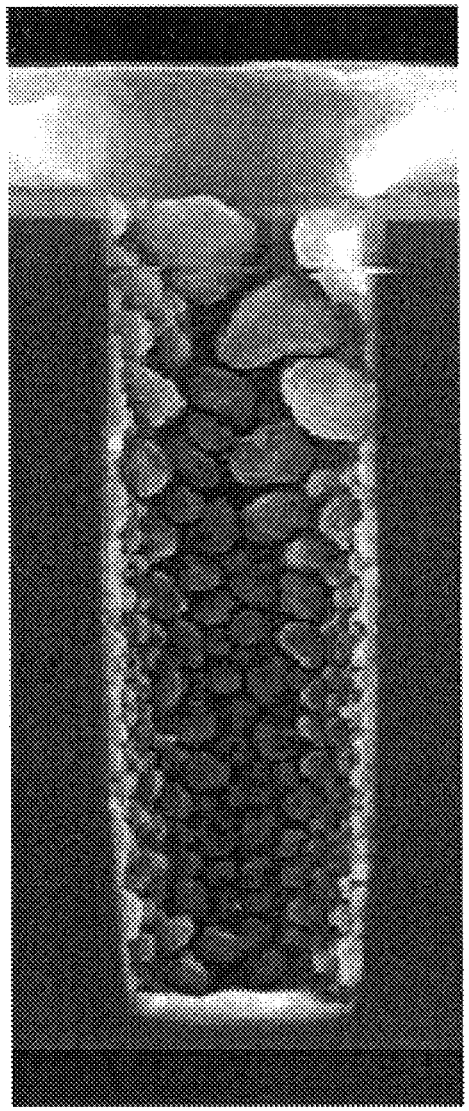
FIG. 2 is a micrograph depicting the problem of thin discontinuous PVD seed layers in high aspect ratio, narrow features.
Figure 2:
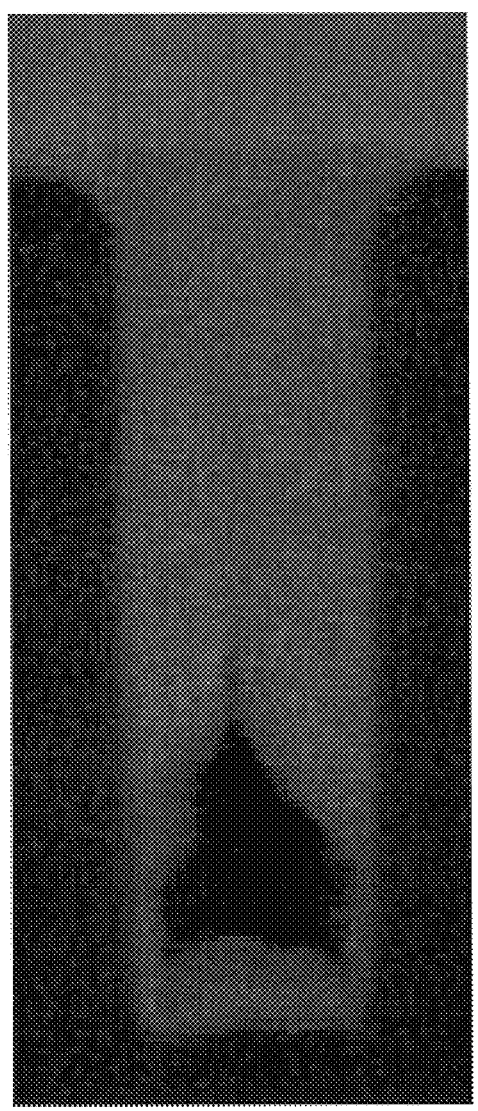

Often the PVD process will produce a copper layer that is at least partially discontinuous. See FIG. 2. In such cases, the initial portion of the seed layer must be repaired or else the subsequent electroplating operation will produce defective copper lines and interconnects.

To complete formation of the copper seed layer or repair a defective seed layer (depending upon perspective), the next process operation is electroless copper plating. See block 307. Details of this process will be presented below. For now, simply understand that the electroless plating produces a continuous copper seed layer that facilitates subsequent high-quality bottom up filling by electrodeposition. During the process, the deposition rate and/or seed layer thickness is monitored.

After copper has been deposited to a desired thickness via the electroless process, the wafer is removed from the plating bath as illustrated at block 309. Then, the wafer is rinsed to quench the electroless deposition process. See block 311. Optionally, the process may dry the wafer. Drying is beneficial if the wafer is to be stored in the repaired condition for some length of time (e.g., up to a week). Preferably, the rinsing or rinse/dry operation is performed in a processing unit (rinse/dry unit) that is separate from both the electroless plating reactor and the electroplating cell.

After the wafer has been rinsed and optionally dried, it is moved to an electroplating cell. See block 311. In one embodiment, the electroplating cell is part of a single tool that includes the electroless reaction vessel and the rinse/dry unit. Each of these separate units may be accessed by a single wafer handling robot or group of robots.

Following drying, the wafer may be annealed prior to electroplating. This is an optional component of block 311. The annealing process is intended to reduce stress and the detrimental effects of hydrogen on the deposited film which can cause delamination of the film (e.g., blistering). As noted elsewhere herein, this blistering problem is also addressed by addition of certain polymers to the electroless bath.

As plated, electroless films of approximately 150 angstroms in thickness exhibit a compressive stress of approximately 1000 MPa. Following anneal at 150 C, stress is reduced to 500 MPa, while at 200 C, stress becomes 500 MPa tensile. An anneal at a temperature of about 175 C (or more generally 150 to 200 C) for about 30 to 90 seconds results in low stress (near 0 MPa) electroless films. The anneal is preferably carried out in a non-oxidizing atmosphere such as forming gas with approximately 4% hydrogen.

Once the wafer has reached the electroplating cell, it is immersed in the electrolyte contained within that cell. See block 315. Electroplating can then proceed when current flows between the wafer and an anode. While not central to this invention, the electrodeposition process is preferably performed in at least two stages. As depicted in FIG. 3, the first stage involves supplying a current level appropriate to cause copper to nucleate on the seed layer. See block 317. Thereafter, the current is adjusted to a level that promotes good bottom up filling of features on the wafer surface. See block 319.

Subsequent processing steps are not central to this invention. They involve planarizing the wafer to remove copper back down to the level of the field regions of the dielectric. Additional dielectric is then deposited to either passivate the device or provide a substrate for a subsequent metallization layer.

While the present invention can be employed to assist in formation of copper seed layers on any substrate surface having openings, it is particularly advantageous when used with substrates having high aspect ratio, small width openings. Trenches and vias in integrated circuit fabrication are good examples of such openings. In particularly preferred embodiments, the invention is employed with wafer surfaces having trenches and/or vias (or any type of Damascene structure) of aspect ratio about 4:1 or greater; more preferably about 6:1 or greater. Further, the smallest among these features preferably have a width of not greater than about 0.2 micrometers; more preferably not greater than about 0.1 micrometers. Usually, there will be a range of feature sizes on a given pattern. The smaller features may be as small as 0.05 to 0.3 micrometers in width. Larger features may be several micrometers in size.

Such features/recesses are often formed on dielectric layers of partially fabricated integrated circuits. As indicated above, Damascene processes typically require formation of copper seed layer. Thus, the present invention finds particular applicability in Damascene processes for fabricating integrated circuits.

The thickness of the electroless deposited layer will vary depending upon the needs of the particular process. More specifically, thicker and relatively continuous PVD copper seed layer components will require relatively little electroless copper. On the other hand, relatively thin and discontinuous PVD layers will require additional electroless copper. For many seed repair embodiments, the electroless deposited copper will have a thickness in the range of about 30–300 Angstroms, more preferably in the range of about 50–125 Angstroms. In typical processes, the initial partially formed copper layer formed by PVD is between about 250 to 1500 angstroms in thickness.

Note that this application refers to deposition of "copper" seed layers. The use of "copper" herein refers to pure elemental copper as well as various copper alloys such as copper-aluminum alloys, etc. Generally, to qualify as a copper seed layer, the material should contain at least about 50% atomic copper. Note that the PVD initial component of the seed layer and the electroless component of the seed layer may have the same or different compositions. Preferably, each has at least 50% copper.

The Electroless Plating Bath

The electroless bath contains at least the following components: a source of copper ions, a reducing agent, a complexing agent, and a pH adjuster. The bath optionally includes one or more surfactants and/or one or more stabilizers.

For most electroless baths employed with this invention an alkaline pH is employed. This allows for a negative free energy of the plating reaction, which can be achieved when the half-cell reaction for the reduction reaction $Cu^{2+} \rightarrow Cu$ (0) requires less energy than the half cell reaction for the oxidation reaction (e.g., glyoxylic acid→glyoxylate). The energy required for the reduction reaction varies with pH due to complexation and other factors such that the overall reaction becomes favorable only at alkaline pH values.

Thus, in preferred embodiments of this invention, the pH of the electroless plating bath is greater than 7. More preferably, the plating bath pH lies between about 12 and 13 (most preferably between about 12.2 and 13.0). To adjust the pH, hydroxide is added to the aqueous electroless copper plating solution. Preferably, hydroxide is added in a form that does not include lithium, sodium, or potassium ions (or other ion that can be detrimental to semiconductor device performance). Beyond this, the exact nature of the pH adjuster is not critical to the performance of this invention. For IC fabrication, tetramethyl ammonium hydroxide or other alkali metal-free compound is desired.

At the relatively high pH is required for effective electroless plating, it is possible that copper ions in solution may precipitate out as insoluble copper hydroxide. Obviously, precipitated copper is unavailable for electroless plating on to substrate surfaces. Therefore, steps can be taken to ensure that copper ions remain soluble at the relatively high pHs employed with the electroless baths of this invention. To this end, the electroless bath preferably includes a complexing agent. Any complexing agent capable of acting as a ligand for copper ions will be suitable. Examples include ethylenediamine tetraacetic acid (EDTA) pyrophosphate, ethylenediamine, and the like. EDTA is a particularly preferred complexing agent for use with this invention.

Considerations for selecting a reducing agent include the rate of reaction and stability of the bath at a given temperature as well as the toxicity of the chosen agent. Note that the reducing agent provides the chemical driving force for reduction of copper ions from the plating bath to neutral copper metal deposited on the substrate surface. The chosen reducing agent should provide a consistent and reasonably fast (approximately 50 to 500 angstroms per minute) rate of reaction at a relatively low temperature. The reducing agent should readily give up electrons at the substrate surface—particularly at the previously deposited portion of the copper seed layer. Unfortunately, many strong reducing agents appear ineffective for this purpose. Aldehyde containing compounds such as formaldehyde, however, have been determined to give good results. A particularly preferred reducing agent is glyoxylic acid, which includes aldehyde and carboxylic acid moieties. Preferably, the aldehyde-containing reducing agent is provided at a molar concentration of between about 0.01 and 0.2 moles/L; more preferably between about 0.02 and 0.1 moles/L.

Surfactants can be added to the electroless copper bath to modify grain structure, improve wetting, improve bath stability, and help displace evolved hydrogen gas. Examples of the suitable surfactants include PEG, PPG, triton X-100, RE610, and the like. In one specific embodiment, polyethylene glycol serves as a surfactant. The "Triton" surfactants available from Rohm and Haas of Philadelphia, Pa. and RE610 available from Rhone Poulenc of Cedex France have been found to work as suitable surfactants.

In a preferred embodiment, the concentration of polyethylene glycol in the electroless plating bath ranges up to about 1000 ppm more preferably between about 100 and 500 ppm. Generally, the surfactant should be added in an amount sufficient to effect the desired goals (e.g. good wetting, bath stability, etc.). Note that one of the principal difficulties observed in electroless deposition of copper is blistering caused by accumulated hydrogen at the interface within the deposit. The addition of surfactants to the plating bath seems to reduce the incidence of and severity of hydrogen-based blistering.

Other additives include cyanide and certain metal salts such as salts of lead and arsenic that modify the plating surface by adsorbing thereto.

A source of copper ions (e.g. a copper salt) must be added to the electroless bath. The copper ions can be added as a variety of salts such as copper sulfate pentahydrate, cupric chloride, etc. The concentration of copper ions is preferably between about 0.5 and 10 g/L; more preferably between about 1 and 4 g/L. The amount of complexing agent added to the electroless bath is a function of the concentration of copper salt in the bath. Generally, the amount of complexing agent should be sufficient to complex all of the copper ions initially present in the bath (except as defined by the stability of the product of $Cu^{2+}$ and the complexing agent). Thus, the molar amount of complexing agent should be comparable to, or slightly in excess of, the molar amount of copper.

As an example, one particularly preferred plating bath includes the following components in aqueous solution:
14 g/L EDTA
pH 12.5–12.8
6.5 g/L glyoxylic acid
1.25 g/L copper (provided as copper ions in solution)
Optional: 100–500 parts per million PEG 4600

Other Electroless Process Parameters

Temperature and flow conditions can strongly impact the rate of electroless deposition. Given the rate of deposition and the desired thickness of the electroless plated seed layer, one can determine the total plating time.

In a preferred embodiment, the electroless bath temperature is held at a temperature or relatively narrow range of temperatures between about 25 and 80 degrees C.; more preferably between 40 and 60 degrees C. In a specific embodiment, the above plating solution is preferably used at a temperature of about 40C (for about 1–3 minutes).

Further, in order to achieve uniform deposit thickness across the wafer surface, the temperature and flow conditions should be consistent at each point on the wafer surface. This is best achieved by ensuring that the plating solution is consistently well mixed. Hence a suitable electrolyte flow rate should be maintained across the wafer surface. To this end, the wafer may be rotated, the electrolyte may be separately agitated, and/or the electrolyte may be forced to flow over the wafer surface.

Apparatus

The apparatus employed in the electroless seed formation processes of this invention can have a significant impact on the quality of the resulting seed layer and the efficiency of the process. The apparatus can control the flow, temperature, and wetting dependence of the electroless process. Each of these parameters strongly impacts the final quality of the seed layer. The apparatus can also monitor the state of the electroless deposition process.

Various apparatus designs can meet the requirements for good electroless plating. Some of the important design parameters will be described in more detail below. One preferred apparatus structure for electroless deposition employs a "clamshell" design, which holds the wafer during the plating operation. Clamshell designs for electroplating copper onto semiconductor wafers are described in U.S. Pat. Nos. 6,156,167 and 6,139,712 (incorporated herein by reference for all purposes). A clamshell design is actually employed in commercial electroplating apparatus available from Novellus Corporation of San Jose, Calif. (the SABRE™ clamshell electroplating apparatus). For use with this invention, the clamshell design seals the wafer backside from the plating solution while allowing electroless plating to proceed on the copper seed very near the circumferential edge bevel of the wafer. The design will be described in more detail below with reference to FIGS. 5A and 5B.

Figure 4:
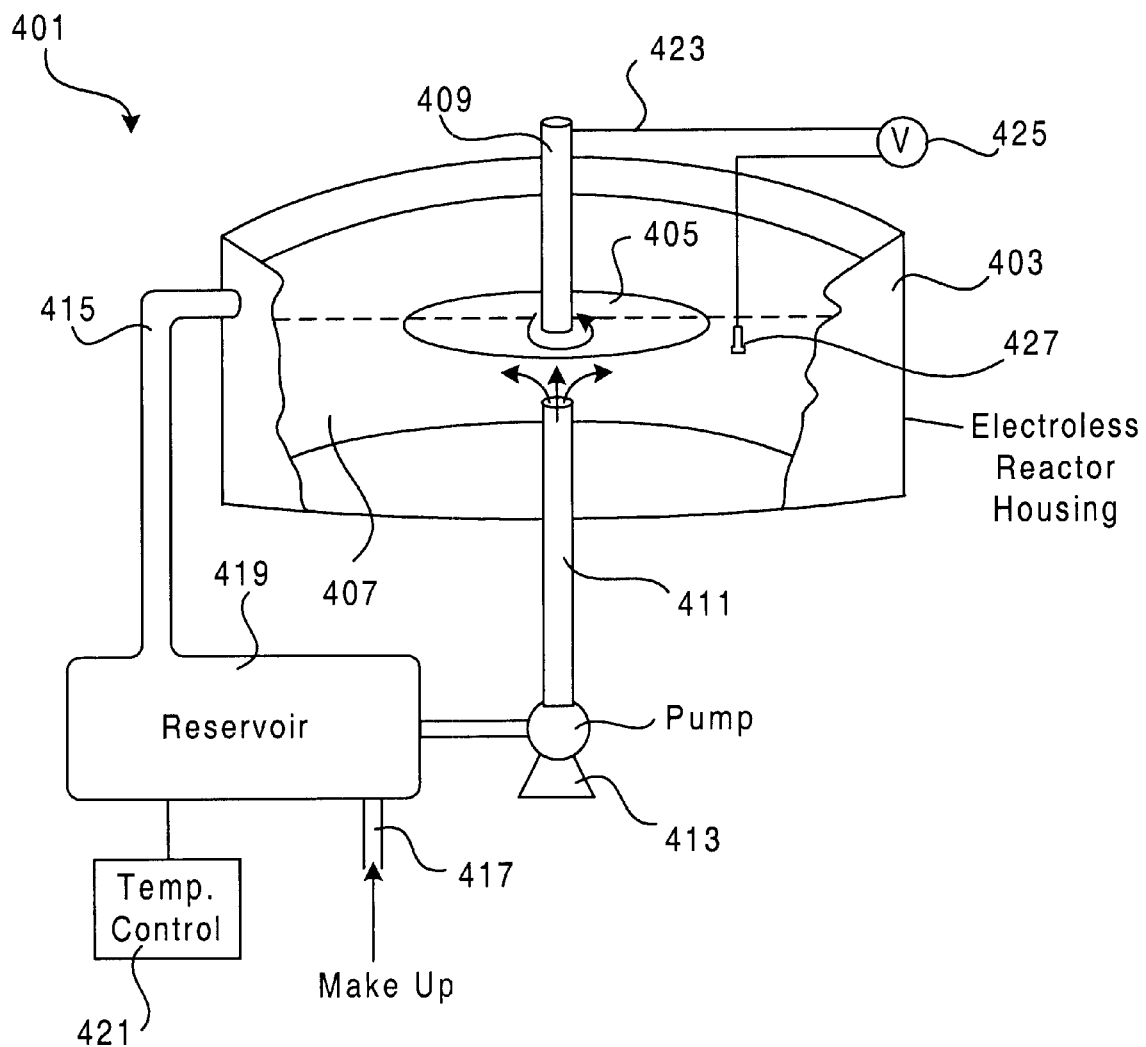
FIG. 4 is a schematic illustration of an electroless plating apparatus suitable for generating seed layers in accordance with this invention.

FIG. 4 depicts in schematic fashion a suitable apparatus for use with this invention. The apparatus includes general systems/components for housing the electroless plating solution, flowing electroless plating solution over the wafer, temperature control, and confirming that deposition is proceeding at a non-negligible rate. Optionally, the apparatus also monitors the thickness of the seed layer by measuring resistivity, for example.

1. Reactor Vessel

In the embodiment depicted in FIG. 4, a plating cell 401 includes a cylindrical container 403 with a volume adequate to maintain thermal stability when a substrate (wafer) 405 is held in place in a bath 407. In a specific embodiment, the plating cell volume ranges from about five to eight liters. This is adequate for plating 200 millimeter and 300 millimeter semiconductor wafers. While not shown in this figure, wafer 405 is held in a wafer holder such as the above referenced clamshell wafer apparatus.

2. Flow/Agitation

The flow and agitation of electrolyte with respect to the substrate being plated may have at least two separate phases. Initially, during wafer entry into the plating bath, one phase is used. And then during the main electroless plating operation, a second phase or set of conditions is used. The process may have different (or identical) electrolyte flow and substrate orientation parameters for these two phases.

Preferably, the wafer enters the bath in a way allowing good wetting of the wafer surface. This can be achieved by a combination of wafer rotation and angled entry of the wafer relative to the surface of the plating bath. An angle of about three to ten degrees and a rotation rate of about 25–125 RPM during immersion and at the beginning of the process have been found to fully displace air from the substrate surface and provide good wetting. Once the process begins, the ability to decrease flow at the wafer surface helps maintain the process rate when using chemically stable electroless baths containing PEG or other surfactants. This is achieved by decreasing the rotation rate to a value of about 5–50 RPM once the process begins. This is permitted because the higher flow needed initially also serves to deliver the PEG or other polymers to the wafer surface at a rate proportional to flow intensity. When these polymers accumulate at the surface, they can occupy growth sites otherwise available for electroless deposition and thus decrease process rate. Certain polymers show this behavior, but not all.

During the main electroless plating operation, the wafer may remain tilted at an angle of about three to ten degrees or it may be tilted back to horizontal, as depicted in FIG. 4.

The substrate and associated holder rotate under the control of a rotation actuator 409. Details of suitable actuators and associated mechanisms for controlling substrate rotation and angular orientation are described in U.S. patent application Ser. No. 09/872,341, filed May 31, 2001, naming Reid et al. as inventors and titled "METHODS AND APPARATUS FOR CONTROLLED-ANGLE WAFER POSITIONING." That application is incorporated herein by reference for all purposes. While the apparatus described in that application is geared toward and electroplating apparatus, many structural and functional aspects of the design can be applied to electroless plating systems of this invention.

It should be noted that, aside from substrate rotation, no other method of agitation is required in this invention. As shown in FIG. 4, however reactor 401 includes an electrolyte flow system that directs electrolyte onto substrate 405 by pumping it into the reactor via an inlet tube 411. A pump 413 delivers the electrolyte.

In the depicted embodiment, the electrolyte circulates through reactor 401 via an outlet line 415 and the inlet line 411. The outlet from the reactor may take many different forms. Some of these are described in U.S. patent applications Ser. No. 09/872,340 (METHODS AND APPARATUS FOR BUBBLE REMOVAL IN WAFER WET PROCESSING), and 09/706,272 (COPPER ELECTROPLATING METHOD AND APPARATUS) filed May 31, 2001 and Nov. 3, 2000, respectively, both of which are incorporated herein by reference for all purposes.

As reactant is consumed during the electroless plating operation, some fresh make up solution may flow into the recirculation loop via a make up line 417. Generally, the make up solution is provided as needed. Given that the plating rate should be relatively constant and that consumption of electroless bath components should be relatively constant, make up solution can be added on a regular schedule. In one embodiment, copper salt and any other consumable is added following a set time or substrate count.

3. Temperature Control

As indicated, the solution temperature is preferably maintained in a range of between about 40–60C. To maintain this range, an adequate heating system is required. This can be accomplished by directly placing a heat exchanger unit in the plating cell or by recirculating some portion of the flow through a heating unit. Backside heating of the wafer during immersion in the electroless bath can also be used to increase the rate of deposition at the wafer surface while maintaining the bulk plating solution at a lower temperature at which it is more stable.

In the depicted embodiment of FIG. 4, a reservoir 419 holds a supply of electroless plating solution. The temperature of the solution in reservoir 419, and hence in reactor 401, is controlled by a temperature controller 421, which may include one more heat exchangers, thermocouples, or other temperature sensors.

4. Monitoring Activity of Electroless Plating Process

In order to confirm the activity of the electroless process the voltage of the wafer surface may be measured relative to a reference electrode. The potential between a reference electrode and substrate undergoing a chemical reaction in an electrolyte is given by thermodynamic half cell reactions taking place at each electrode (the substrate serving as one electrode in a galvanic cell), as well as the reaction kinetics and mass transfer to the surfaces. If the reaction at the substrate changes during deposition, then the potential versus the reference electrode will also change.

In the depicted embodiment, an electrical connection 423 is made to the substrate 405. This connection allows input to a high impedance voltmeter 425. The voltmeter is also connected to a reference electrode 427 that is immersed in the electroless bath 407. In a typical case, the voltage measured between a saturated calomel reference electrode and the substrate will measure about −0.5V when the wafer is immersed in the bath. Once the electroless process begins the voltage will shift to approximately −0.7 to −0.8V. This voltage will be maintained as long as the process continues at a non-negligible rate. If the voltage drops back to −0.5 to −0.6V it is an indication that the plating rate of the electroless bath as diminished to near zero. When the system detects that the voltage has reached a problematic region, the process is halted for further evaluation or correction.

5. Monitoring Thickness

To create high-quality quality plated substrates, the process should maintain highly uniform distributions of deposited metal. The uniformity of the plated metal can be directly correlated not only to the uniformity of the plating process, but also to the continuity of the seed layer used to initiate the plating process. Thus, it is important to initiate an electroplate process with a seed layer that has very little if any discontinuous portions.

One way to effectively assess the overall continuity of the seed layer is by measuring its resistance profile across the wafer. Apparatus used with this invention may allow high-precision (multi-point) resistance measurements of seed layers. Specifically, the invention may employ a plurality of electrical contacts (not depicted in FIG. 4) that are embedded within the wafer holder (e.g., a clamshell design holder). The contacts are part of a circuit for measuring resistance of the seed layer deposited on the wafer. Preferably (but not necessarily) this circuit is used to measure the resistance of the seed layer before and during electroless plating. The circuitry and contact design for measuring resistance are well known in the art.

6. Seed Forms at Edge Bevel Region

The deposition of the electroless copper in the near-bevel region can be important to the performance in the subsequent electroplating step. Too little copper near the bevel creates a high electrical resistance in this region where electrical contact must be made during electroplating. Ohmic heating, damage to the seed, and a poor electroplated thickness distribution can result. A clean, oxide-free, high surface area contact will reduce resistive heating.

7. Clamshell Design

Figure 5A:
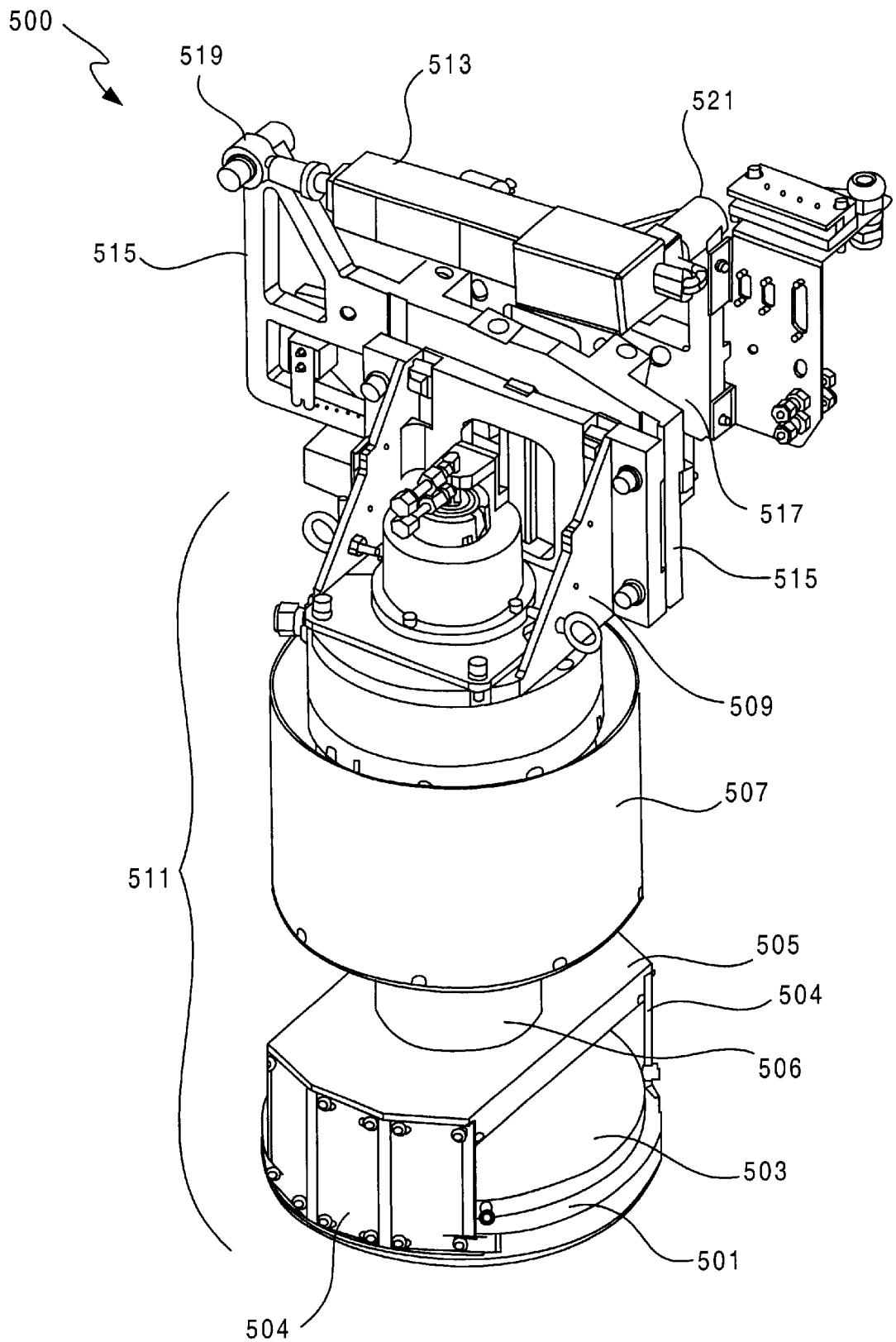
FIG. 5A depicts a wafer holder assembly for electrochemically treating semiconductor wafers used in accordance with the invention.

FIG. 5A provides a perspective view of a wafer holding and positioning apparatus 500 for electroless treating semiconductor wafers. It includes wafer engaging components (sometimes referred to herein as "clamshell" components). The actual clamshell assembly comprises a cup 501 and a cone 503. As will be shown in FIG. 5B, cup 501 holds a wafer and cone 503 clamps the wafer securely in the cup.

The clamshell assembly (cup 501 and cone 503) is supported by struts 504, which are connected to a top plate 505. This assembly (501–505) is driven by a motor 507, via a spindle 506. Motor 507 is attached to a mounting bracket 509. Spindle 506 transmits torque to a wafer (not shown in this figure) to allow rotation during electroless plating. An air cylinder (not shown) within spindle 506 also provides vertical force to clamp the wafer between cup 501 and cone 503. For the purposes of this discussion, the assembly including components 501–509 is collectively referred to as a wafer holder, 511. Note however, that the concept of a "wafer holder" extends generally to various combinations and subcombinations of components that engage a wafer and allow its movement and positioning.

A tilting assembly including a first plate 515 that is slidably connected to a second plate 517, is connected to mounting bracket 509. A drive cylinder 513 is connected both to plate 515 and plate 517 at pivot joints 519 and 521, respectively. Thus, drive cylinder. 513 provides force for sliding plate 515 (and thus wafer holder 511) across plate 517. The distal end of wafer holder 511 (i.e. mounting bracket 509) is moved along an arced path (not shown) which defines the contact region between plates 515 and 517, and thus the proximal end of wafer holder 511 (i.e. cup and cone assembly) is tilted upon a virtual pivot.

The entire apparatus 500 is lifted vertically either up or down to immerse the proximal end of wafer holder 511 into an electroless plating solution via another actuator (not shown). Thus, a two-component positioning mechanism provides both vertical movement along a trajectory perpendicular to a solution and a tilting movement allowing deviation from a horizontal orientation (parallel to solution surface) for the wafer (angled-wafer immersion capability).

Note that the apparatus 500 is typically used with a particular electroless reactor having plumbing or plumbing connections for circulating electrolyte through the plating reactor - and against the work piece being plated. The electroless reactor may also include a separate membrane for controlling electrolyte flow patterns. For example, a diffuser membrane is employed for directing plating solution upward toward the rotating substrate in a uniform front. This embodiment is described in U.S. patent application Ser. No. 09/927,740, filed Aug. 10, 2001, naming Mayer et al. as inventors, and titled "METHODS AND APPARATUS FOR CONTROLLING ELECTROLYTE FLOW FOR UNIFORM PLATING," which is incorporated herein by reference for all purposes.

Figure 5B:
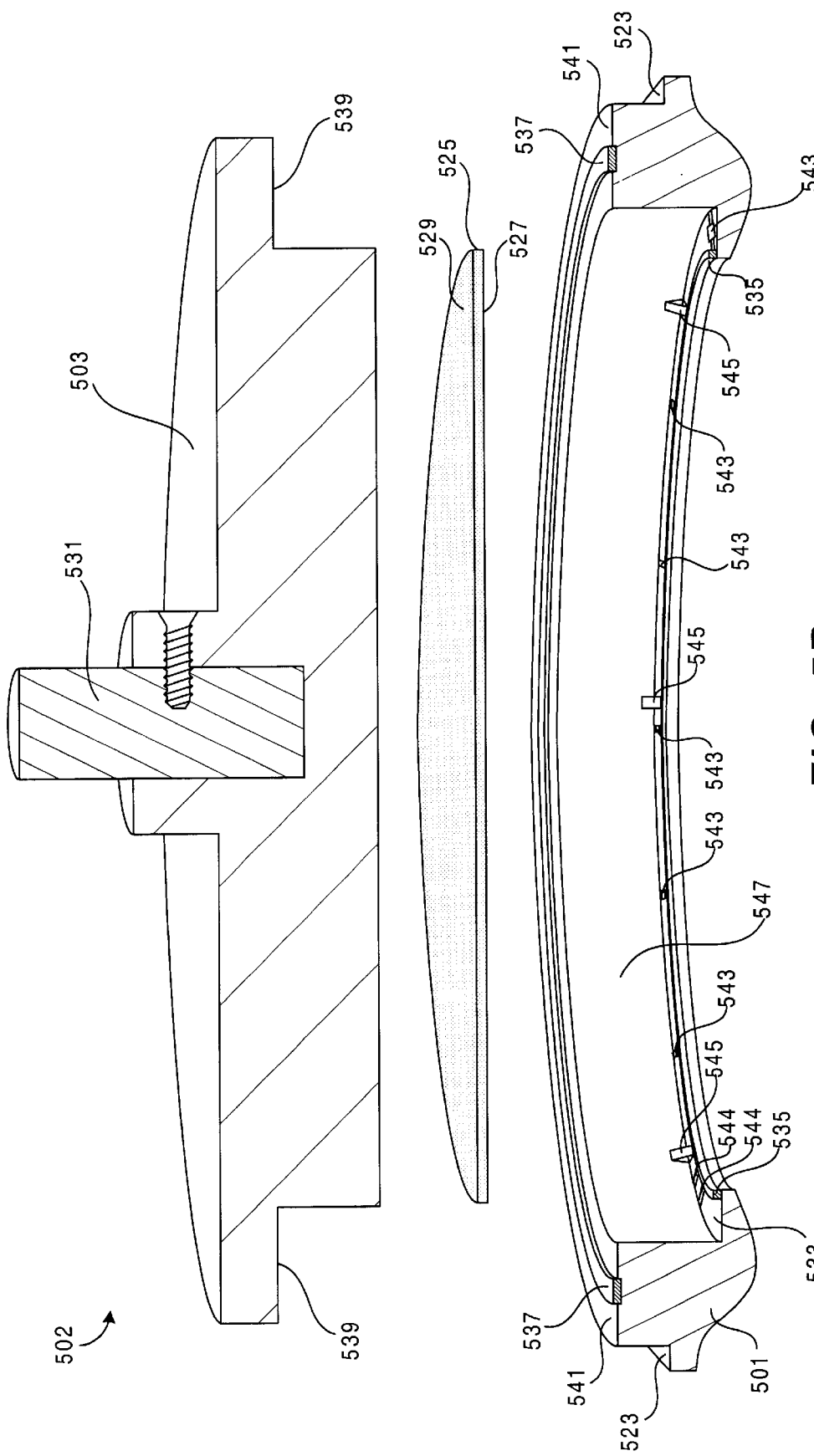
FIG. 5B is a cross sectional diagram depicting aspects of a cup and cone assembly of an electroplating apparatus in accordance with the invention.

FIG. 5B shows cup 501 and cone 503 in more detail and for consistency uses reference numbers from FIG. 5A. Specifically, FIG. 5B is a cross sectional depiction of a portion, 502, of assembly 500, including cup 501 and cone 503. Note that this figure is not meant to be an absolutely accurate depiction of the cup and cone assembly, but rather a stylized depiction for discussion purposes. Cup 501 is supported by top plate 505 via struts 504 (refer to FIG. 5A, struts 504 are secured to cup 501 in the area of outer edge 523 (depicted in FIG. 5B)). Cone 503 moves vertically within the assembly including the cup, struts, and top plate via air cylinder 531. Generally, cup 501 provides a support upon which wafer 525 rests. It includes an opening through which electrolyte from a plating cell can contact the wafer. Note that wafer 525 has a front side 527, which is where plating occurs. Only the periphery of wafer 525 rests on the cup. When engaged with cup 501, cone 503 presses down on the back side of the wafer, 529, to hold it in place during electroless plating.

To load a wafer into assembly 502, cone 503 is held in a raised position, as depicted, via air cylinder 531 (until cone 503 touches top plate 505). From this position, a gap is created between the cup and the cone into which wafer 525 can be inserted, and thus loaded into the cup. Note in FIG. 5A that struts 504 are positioned on opposing sides of cup 501, covering only part of its circumference, thus the wafer is inserted between the opposing struts. Once the wafer is resting on cup 501, cone 503 is lowered to engage the wafer against the periphery of cup 501. As indicated, wafer plating preferably occurs while the wafer is rotating. If electroless plating solution flows upward towards the wafer, the rotation provides nearly uniform mass transfer to the wafer over the entire radial extent of the wafer.

Cup 501 supports wafer 525 via a lip 533. More specifically, the lip has a compressible lip seal 535, which forms a fluid-tight seal when cone 503 engages wafer 525 against lip seal 535. The lip seal prevents electroless plating solution from contacting the backside of wafer 525 (where it could introduce contaminating atoms such copper directly into silicon) and from contacting sensitive components of apparatus 501. Also shown is seal 537, which is also compressed (between ledge 539 of the cone and surface 541 of the cup) to form a fluid tight seal when cone 503 engages wafer 525. Thus, once the cup and cone are engaged, the wafer backside is protected from solution exposure. Again, this figure is a simplified depiction.

As mentioned, before initiation of electroless plating, wafer 525 is introduced to assembly 502 when cone 503 is raised above cup 501. When the wafer is initially introduced—typically by a robot end effector—its outermost edge rests lightly on lip seal 535. Wafer 525 must electrically contact a current source to maintain a potential difference between the anode and cathode (the wafer itself). In this invention, lip seal 535 has embedded electrical contacts (not depicted in FIG. 5B) that are connected to a plurality of electrical connections. Connections 543 and 544 are part of a circuit for measuring resistance of the copper seed layer deposited on the wafer.

Also shown in FIG. 5B, on lip 533 of cup 501, are a plurality of wafer guides, 545. These guides are used to orient wafer 525 such that its outermost edge aligns accurately with lip seal 535. Note, cup 501 includes a circumferential side wall 547 which defines an interior region of the cup and a lip 533 for supporting wafer 525. The invention is not limited to cups of this shape or configuration. A "cup" of the invention can include a similar structure not having a circumferential side wall. For example, a ring structure with a flat top surface (including an inner edge or "lip") and only wafer guides 545 may define a "cup" in the context of this invention.

Figure 5C:
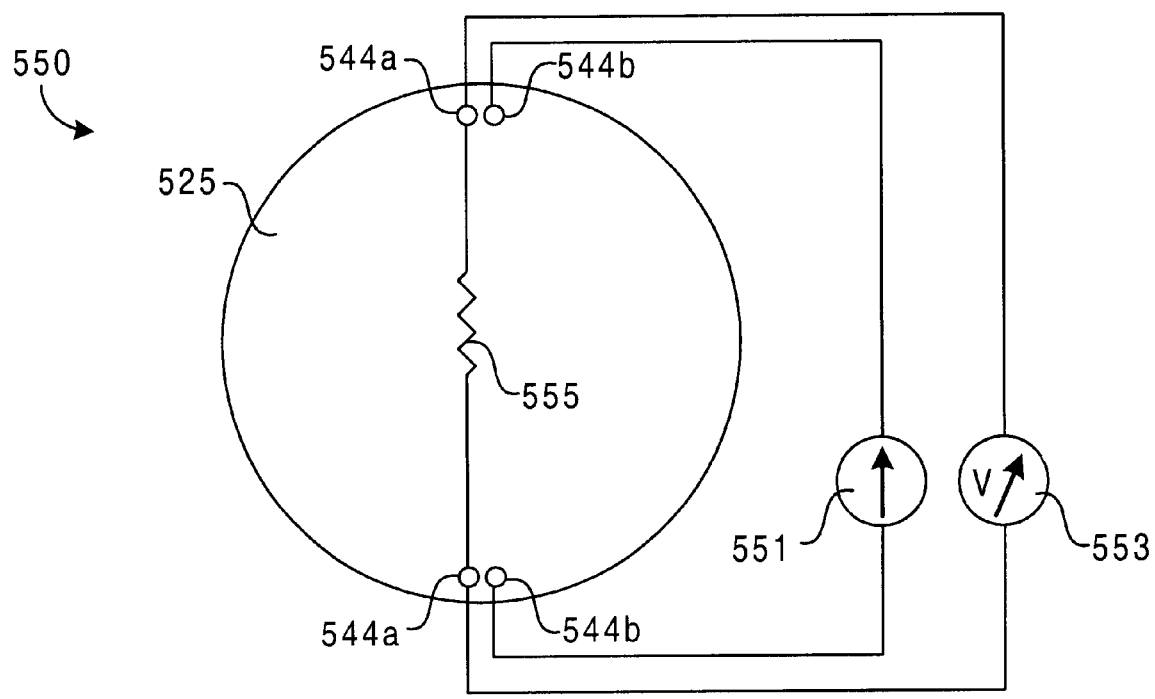
FIG. 5C is a simplified circuit diagram showing a preferred configuration for measuring the resistance of a seed layer in accordance with the invention.

FIG. 5C is a simplified circuit diagram depicting a continuity check circuit, 550, for assessing the continuity of a seed layer on a wafer. There are four electrical connections 544 that contact (via their associated contacts 551) a seed layer (not depicted) on wafer 525. In this case, connections 544 are divided into two pairs of opposing connections, 544a and 544b. Electrical connections 544a are wired to a voltmeter 553. Connections 544b are wired to a current source 551, and thus provide a current that flows through the seed layer on wafer 525. Once a current flow is established, voltmeter 553 (via connections 544a) is used to measure the resistance 555 of the metal (seed) layer. By using a known standard seed layer resistance measurement, at the same current level, the continuity and/or thickness of the seed layer can be accurately determined.

EXAMPLES

Experimental work has evaluated bath temperatures from 35 to 70 degrees C. and flow from slight to nearly turbulent. Thickness distribution results on 200-millimeter wafers obtained in a PEG-free bath as described above or shown below.

| Wafer ID | Bath T, C | Plating Time Minutes | EL Cu Thickness (Å) | Rs, O/sq PVD Cu + EL Cu | 1 std dev, % |
|---|---|---|---|---|---|
| 1 | 44.5 | 0.5 | 94 | 0.1233 | 1.4 |
| 2 | 44 | 1 | 318 | 0.1112 | 1.43 |
| 3 | 42 | 2 | 641 | 0.0954 | 1.49 |
| 4 | 41 | 5 | 1460 | 0.0705 | 1.53 |
| 5 | 40 | 2 | 494 | 0.1021 | 2.06 |
| 6 | 38–37 | 5 | 994 | 0.0828 | 2.5 |
| 7 | 35 | 2 | 326 | 0.0111 | 2.22 |

Note that Rs is the sheet resistance mean of the PVD + electroless layer composite (ohms/square units). And "1 std dev" refers to the percent standard deviation of the sheet resistance.

Figure 6:
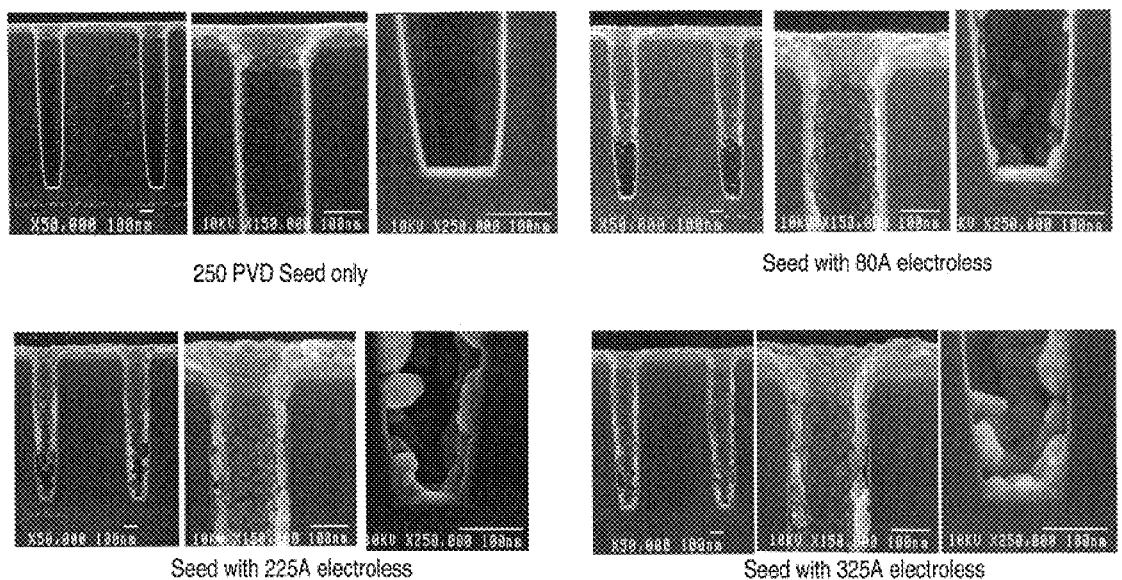
FIGS. 6–8 are micrographs showing the coverage of 80 angstrom, 225 angstrom, and 325 angstrom electroless copper layers on initial PVD copper thickness of 250 angstrom, 500 angstrom, and 750 angstrom within 6:1 aspect ratio 0.20 micron vias.
Figure 7:
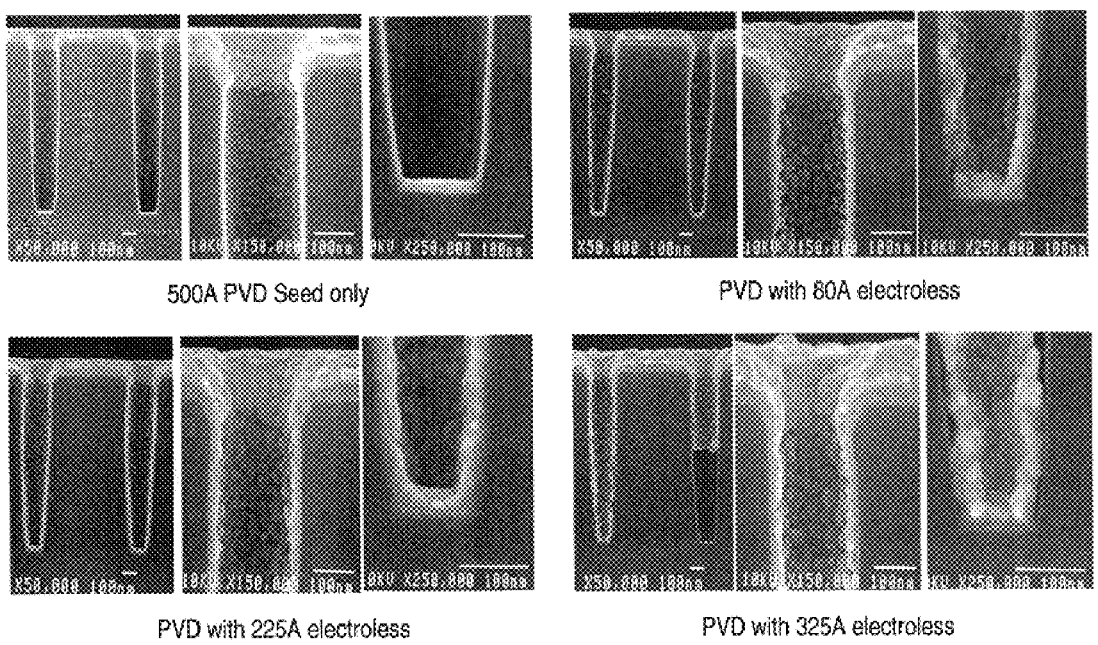
Figure 8:
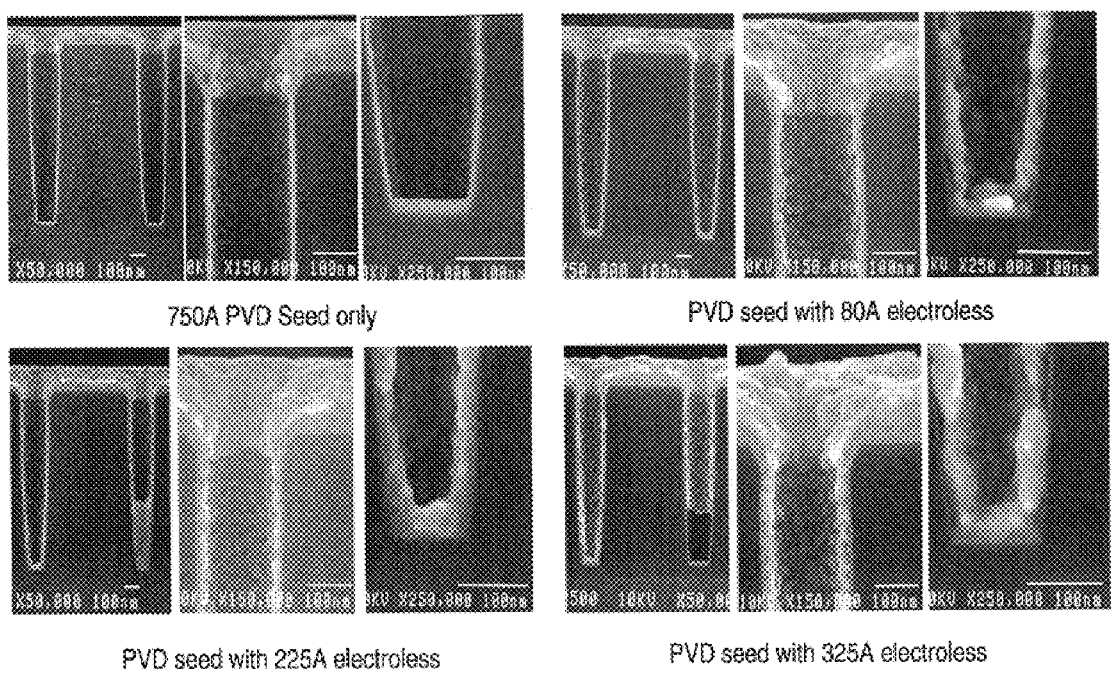

FIGS. 6, 7, and 8 show the coverage of 80 angstrom, 225 angstrom, and 325 angstrom electroless copper layers on initial PVD copper thickness of 250 angstrom, 500 angstrom, and 750 angstrom within 6:1 aspect ratio 0.20 micron vias. The coverage of the PVD deposits with no electroless repair is also shown in each case. Using a 250 angstrom PVD copper seed it is seen that there appears to be virtually no PVD copper in the lower 40% of the via. When an 80 angstrom deposit of electroless copper is formed on this surface it is seen to only grow substantially on the surface of the via which initially shows some evidence of PVD seed. A few isolated granular growths are seen deeper in the via. After 225 and 325 angstrom of electroless copper the coverage of the copper near the base appears to become more continuous, but is still extremely rough. It is thought that the electroless bath is gradually converting some copper oxide which is deposited near the via base to copper metal and subsequently beginning plating on the metal. This is a desirable aspect of the electroless copper chemistry. It allows for more initial oxidation of the PVD deposit without a complete loss in process capability (as is the case for copper sulfate electroplating).

In FIG. 7 it is seen that a 500 angstrom initial PVD copper seed begins to show a lack of copper coverage proceeding from the top of the via to its base. At this PVD thickness, however, the coverage is adequate to allow good initial growth of electroless copper on most surfaces in the via. A substantial copper deposit is seen near the base of the via after only 80 angstrom of electroless deposition. Considerably thicker deposits are obtained in the vias after 225 and 325 angstrom of electroless deposition. It can be seen that after 325 angstrom electroless copper, one via shown has had the copper pulled out during the cleave used for analysis of the deposition result. This indicates considerable mechanical integrity of the deposited film within the via. Note that even though the copper within the vias has become much thicker during electroless deposition, there is not an exaggeration of the necking near the via top which is initially present following PVD seed.

Little difference is observed between the 500 angstrom PVD deposit shown in FIG. 7 and the 750 angstrom PVD deposit shown in FIG. 8. The vias with only 225 angstrom of electroless copper begin to show pull-out during cleave in the 750 angstrom case.

In each of the examples shown in FIGS. 6–8, electroless copper was deposited using the clamshell hardware in an eight inch wafer configuration in the electroless bath described above with an approximately eight liter volume and a temperature of 40C. and a wafer rotation of approximately 50 rpm.

14 g/L EDTA
pH 12.5–12.8
6.5 g/L glyoxylic acid
1.25 g/L copper (provided as ions)
Optional: 100–500 parts per million PEG 4600

The apparatus employed in these examples was a prototype plating tool employing a clamshell design as described above. The plating cell was operated without agitation (but with wafer rotation as mentioned).

Figure 9:
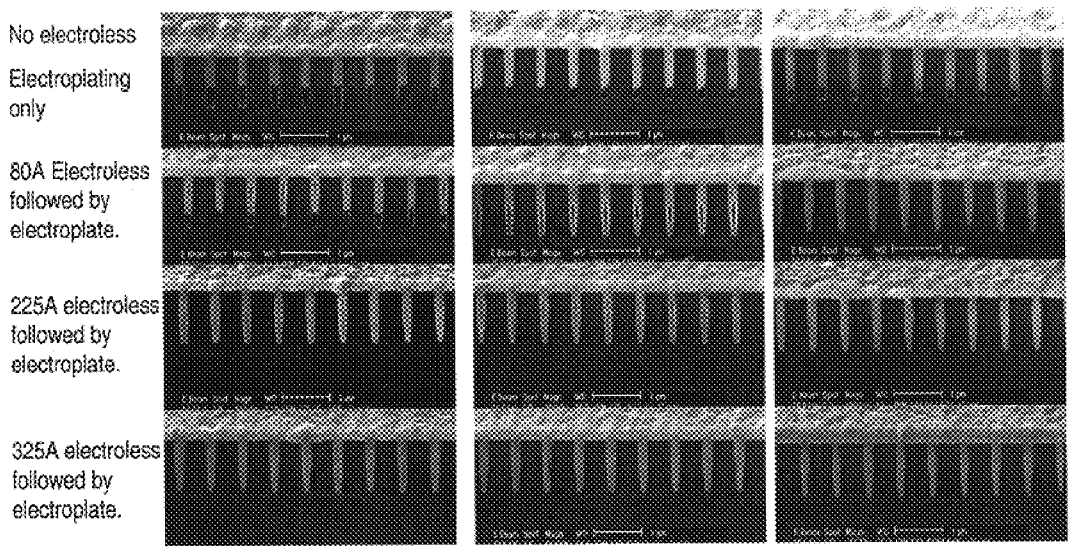
FIG. 9 is a micrograph showing fill results following electroplating on PVD seed layers without and without repair by electroless copper plating.

In FIG. 9 the via fill results following electroplating on PVD seed with and without repair by electroless copper are shown. Vias with initial PVD thicknesses of 250–750A are each filled following 0, 80, 225, and 325 angstroms of electroless copper. Filling was performed using Novellus clamshell hardware in an 8 inch configuration. The filling chemistry used in this test was Shipley Ultrafill in an electrolyte containing 175 g/L acid, 17.5 g/L copper, and 50 mg/L chloride ion. Filling after electroless was also performed in baths using polyethylene glycol/mercaptopropanesulfonic acid additives and Enthone Viaform additives in the same electrolyte. Ultrafill additives also gave excellent fill on seed repaired by electroless copper in electrolytes containing 10 g/L acid and 40 g/L copper.

The result in FIG. 9 shows that with no electroless copper, large bottom voids are seen after electroplating. These bottom voids decrease in size from about 40% of the via volume at 250 angstrom PVD to about 20% of vial volume at 750 angstrom PVD.

When PVD copper is coated with 80 angstrom electroless copper, the bottom voids are seen to generally diminish. On a 250 angstrom PVD seed, the 80 angstrom electroless deposit decreases the size of the bottom voids to about 25% of the via volume but is not effective in eliminating the bottom voids. On a 500 angstrom PVD thickness, the bottom voids are eliminated by the 80 angstrom electroless copper thickness however voids at the center of the vias are significant. This is thought to reflect slow growth in the electroplating bath on seed near the, via base that is only partially repaired. When the initial PVD copper thickness is increased to 750 angstrom, the 80 angstrom electroless deposit results in a fill result change to small center voids near the top of the via. This may be the result of still inadequate repair of the seed by the 80 angstrom electroless deposit or the result of a problem with pinch-off in the overall structure prior to electroplating.

When the electroless copper thickness is increased to 225 or 325 angstrom, the bottom voids in the vias are totally eliminated at all PVD thicknesses. This result appears to correlate well with the quality of the electroless coverage prior to electroplate. When substantial copper is observed at the via base following electroless plating there are no voids following electroplate. In some cases small center voids are still observed in the vias, again reflecting either marginal repair or a structure that is showing too much pinch-off before electroplate.

Figure 10:
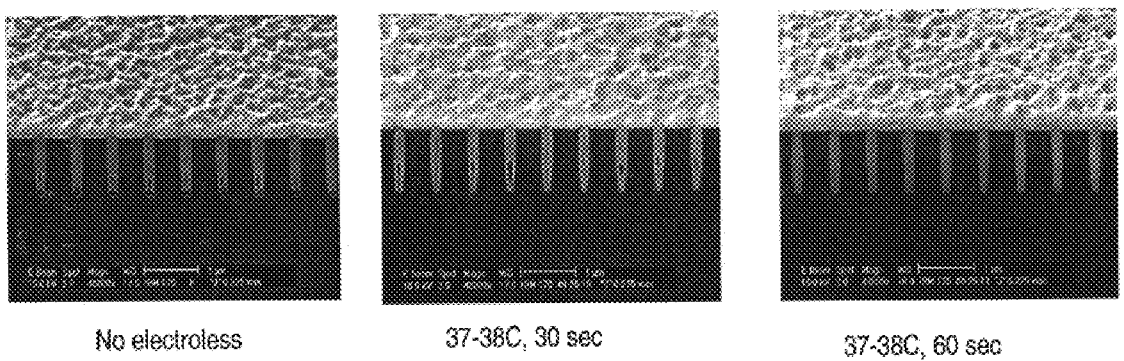
FIG. 10 is a micrograph showing fill results on 1500 angstroms PVD seed layer with no electroless repair and with two different electroless plating thicknesses.

FIG. 10 shows results after filling on 1500 angstrom PVD seed with no electroless repair and with two electroless thicknesses. In this case, all voids are eliminated in the vias when the 60 second (approximately 150 angstrom) electroless is used prior to electroplate.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of forming a copper seed layer on a substrate surface, the method comprising:
    providing a substrate having dielectric layer on its surface and recesses in said dielectric layer, the substrate further comprising a partially complete copper seed layer formed in at least some recesses of the substrate surface;
    contacting the substrate surface with an electroless plating bath comprising a reducing agent and a source of copper ions, to deposit additional copper on the substrate surface; and
    monitoring the plating rate via a potential between the substrate and a reference electrode.

2. The method of claim 1, wherein the reducing agent comprises an aldehyde moiety.

3. The method of claim 1, wherein the reducing agent comprises glyoxylic acid.

4. The method of claim 1, wherein the reducing agent is present in a molar concentration of between about 0.01 and 0.2.

5. The method of claim 1, wherein the electroless plating bath is alkaline.

6. The method of claim 5, wherein electroless plating bath further comprises a hydroxide pH adjuster that does not contain alkali metal ions.

7. The method of claim 6, wherein the pH adjuster is tetramethyl ammonium hydroxide.

8. The method of claim 1, wherein the electroless plating bath further comprises a complexing agent for copper ions.

9. The method of claim 8, wherein the complexing agent is EDTA.

10. The method of claim 1, wherein depositing the additional copper by an electroless copper deposition process is performed at a temperature of between about 25 and 80 degrees C.

11. The method of claim 1, wherein the electroless plating bath further comprises one or more of a surfactant and a stabilizer.

12. The method of claim 11, wherein the surfactant is a polyethylene glycol.

13. The method of claim 1, further comprising flowing the electroless plating bath over the substrate surface during at least a portion of the depositing.

14. The method of claim 1, further comprising rotating the substrate in the electroless plating bath during at lease a portion of the depositing.

15. The method of claim 1, further comprising determining that the electroless plating rate has dropped to approximately zero when the voltage between the reference electrode and the substrate reaches a defined value.

16. The method of claim 15, wherein the reference electrode is a calomel reference electrode and wherein the deposition rate is determined to have dropped to approximately zero when the voltage between the reference electrode and the substrate drops to about 0.6 volts or below.

17. The method of claim 1, further comprising measuring the thickness of the seed layer during deposition of the additional copper by measuring the resistivity of the seed layer.

18. The method of claim 17, wherein a multi-point probe measures the resistivity of the seed layer.

19. The method of claim 1, further comprising annealing the substrate to thereby stabilize the deposited additional copper on the substrate surface.

20. The method of claim 1, wherein at least some of the recesses in said dielectric layer have an aspect ratio of at least about 4:1.

21. A process by which a substrate with a non-continuous physical vapor deposited seed layer is plated with an electroless copper layer comprising:
    placing the substrate in an electroless plating bath in a face down orientation while rotating;
    allowing the substrate to undergo electroless plating while flow to the substrate surface is controlled, at least in part, by the rotation rate of the substrate; and
    monitoring the resistivity of the copper layer to determine the thickness of the copper layer during electroless plating.

22. The process of claim 21, wherein placing the substrate in the electroless plating bath is performed while the substrate is tilted at an angle so as to displace gas from the substrate face.

23. The process of claim 21, further comprising monitoring a voltage between the substrate and a reference electrode during electroless plating.

24. The process of claim 21, further comprising controlling the temperature of the electroless plating bath to thereby control the rate of the electroless plating process.

25. The process of claim 24, wherein the temperature in the plating cell is controlled by a heat exchanger in the plating cell or outside the plating cell.

26. The process of claim 21, wherein the PVD seed layer has a nominal thickness as at least about 250 angstroms.

27. The process of claim 21, wherein the electroless plating process is allowed to continue until the electroless plated copper layer attains a thickness of between about 30–300 angstroms.

28. The process of claim 21, further comprising replenishing the electroless plating bath with make up plating solution.

29. The process of claim 28, wherein the replenishing takes place on a regular basis, following a set time or substrate count.

30. The process of claim 21, wherein the electroless plating bath comprises a surfactant.

31. The process of claim 21, further comprising rinsing the deposited electroless copper layer with water.

32. The process of claim 31, further comprising:
drying the substrate; and
electroplated the substrate at a later time.

33. The process of claim 31, further comprising electroplated the substrate immediately after electroless deposition and rinsing.

34. The process of claim 21, further comprising annealing the substrate to thereby stabilize the electroless copper layer.

* * * * *